(12) United States Patent
Ramsbey et al.

(10) Patent No.: US 10,141,393 B1
(45) Date of Patent: Nov. 27, 2018

(54) THREE DIMENSIONAL CAPACITOR

(71) Applicant: Cypress Semiconductor Corporation, San Jose, CA (US)

(72) Inventors: Mark Ramsbey, Sunnyvale, CA (US); Unsoon Kim, San Jose, CA (US); Shenqing Fang, Sunnyvale, CA (US); Chun Chen, San Jose, CA (US); Kuo Tung Chang, Saratoga, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 5 days.

(21) Appl. No.: 15/060,249

(22) Filed: Mar. 3, 2016

Related U.S. Application Data

(63) Continuation of application No. 13/715,181, filed on Dec. 14, 2012.

(51) Int. Cl.
  *H01L 27/01* (2006.01)
  *H01L 49/02* (2006.01)

(52) U.S. Cl.
  CPC .................................. *H01L 28/60* (2013.01)

(58) Field of Classification Search
  CPC .................................................. H01L 27/0805
  See application file for complete search history.

(56) References Cited

U.S. PATENT DOCUMENTS

| | | | |
|---|---|---|---|
| 5,824,584 A | 10/1998 | Chen et al. | |
| 5,969,383 A | 10/1999 | Chang et al. | |
| 6,528,834 B1 | 3/2003 | Durcan et al. | |
| 6,972,997 B2 | 12/2005 | Ishimaru et al. | |
| 7,057,230 B2 | 6/2006 | Tanaka et al. | |
| 7,115,943 B2 | 10/2006 | Mine et al. | |
| 7,371,631 B2 | 5/2008 | Sakai et al. | |
| 7,414,283 B2 | 8/2008 | Tanaka et al. | |
| 7,504,689 B2 | 3/2009 | Hisamoto et al. | |
| 7,557,005 B2 | 7/2009 | Ishii et al. | |
| 7,663,176 B2 | 2/2010 | Sakai et al. | |
| 7,667,259 B2 | 2/2010 | Yasui et al. | |
| 7,700,992 B2 | 4/2010 | Tanaka et al. | |
| 7,723,779 B2 | 5/2010 | Hisamoto et al. | |
| 7,863,135 B2 | 1/2011 | Sakai et al. | |
| 7,863,670 B2 | 1/2011 | Ishii et al. | |

(Continued)

FOREIGN PATENT DOCUMENTS

| | | |
|---|---|---|
| JP | 2007073964 A | 3/2007 |
| KR | 20080000268 A | 1/2008 |
| KR | 1020080106010 A | 4/2008 |

OTHER PUBLICATIONS

International Search Report for International Application No. PCT/US2013/074713 dated Mar. 27, 2014; 3 pages.

(Continued)

*Primary Examiner* — Raj R Gupta

(57) ABSTRACT

Integrated capacitor structures and methods for fabricating same are provided. In an embodiment, the integrated capacitor structures exploit the capacitance that can be formed in a plane that is perpendicular to that of the substrate, resulting in three-dimensional capacitor structures. This allows for integrated capacitor structures with higher capacitance to be formed over relatively small substrate areas. Embodiments are suitable for use by charge pumps and can be fabricated to have more or less capacitance as desired by the application.

17 Claims, 12 Drawing Sheets

(56) References Cited

U.S. PATENT DOCUMENTS

| | | | |
|---|---|---|---|
| 7,910,967 | B2 | 3/2011 | Shin et al. |
| 7,985,997 | B2 | 7/2011 | Kubota et al. |
| 8,017,986 | B2 | 9/2011 | Tanaka et al. |
| 8,125,012 | B2 | 2/2012 | Mine et al. |
| 2002/0146894 | A1 | 10/2002 | Basceri et al. |
| 2004/0065938 | A1 | 4/2004 | Won et al. |
| 2004/0155234 | A1* | 8/2004 | Ishimaru ............ G11C 16/0433 257/10 |
| 2006/0022260 | A1* | 2/2006 | Hisamoto ......... H01L 21/28273 257/324 |
| 2006/0099760 | A1 | 5/2006 | Kim et al. |
| 2007/0111431 | A1 | 5/2007 | Engelhardt et al. |
| 2011/0211396 | A1 | 9/2011 | Takeuchi |

OTHER PUBLICATIONS

Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.

Matsubara, K., et al., "Highly Reliable 10ns MONOS Flash," elmicro.com/files/renesas/monos_flash_ewe_2008_for_proceedings.pdf, Renesas Technology/Europe GmbH, 2008.

Tanaka, T., et al., "Hitachi," A 512kB MONOS type Flash Memory Module Embedded in a Micro Controller, 211-212, Symposium on VLSI Circuits, Digest of Technical Papers, Semiconductor & Integrated Circuits, Hitachi, Ltd., 2003.

Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Labratories, NEC Corporation, 2008.

USPTO Advisory Action for U.S. Appl. No. 13/715,181 dated May 21, 2015; 5 pages.

USPTO Final Rejection for U.S. Appl. No. 13/715,181 dated Feb. 27, 2015; 9 pages.

USPTO Final Rejection for U.S. Appl. No. 13/715,181 dated Nov. 3, 2015; 13 pages.

USPTO Non-Final Rejection for U.S. Appl. No. 13/715,181 dated Aug. 26, 2015; 11 pages.

USPTO Non-Final Rejection for U.S. Appl. No. 13/715,181 dated Nov. 19, 2014; 12 pages.

Written Opinion of the International Searching Authority for International Application No. PCT/US2013/074713 dated Mar. 27, 2014; 5 pages.

Yanagi, I., et al., "Quantum confinement effect of efficient hole injection in MONOS-type nonvolatile memory-the role of ultrathin i-Si/P+ poly-Si stacked gate structure fabricated by laser spike annealing," 146-147, Symposium on VSLI Technology, Digest of Technical Papers, Central Research Laboratory, Hitachi Ltd., 2007.

JPO Office Action for Application No. 2015547550 dated Oct. 11, 2017; 7 pages.

* cited by examiner

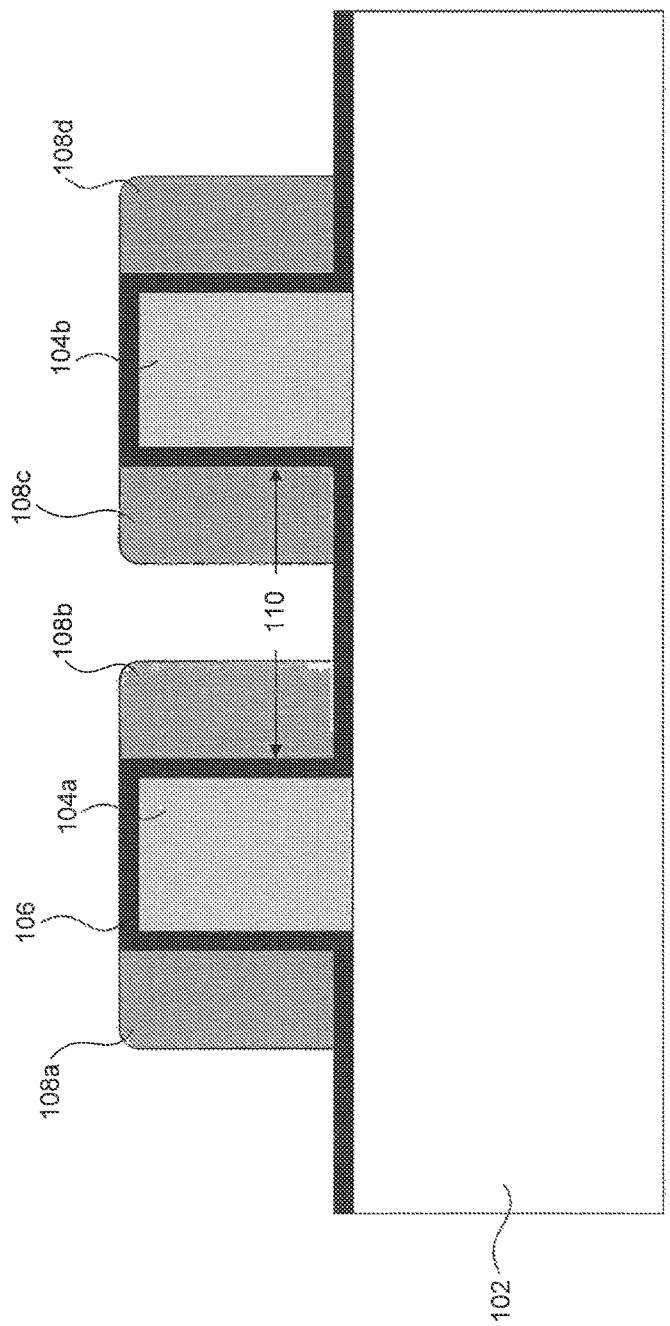

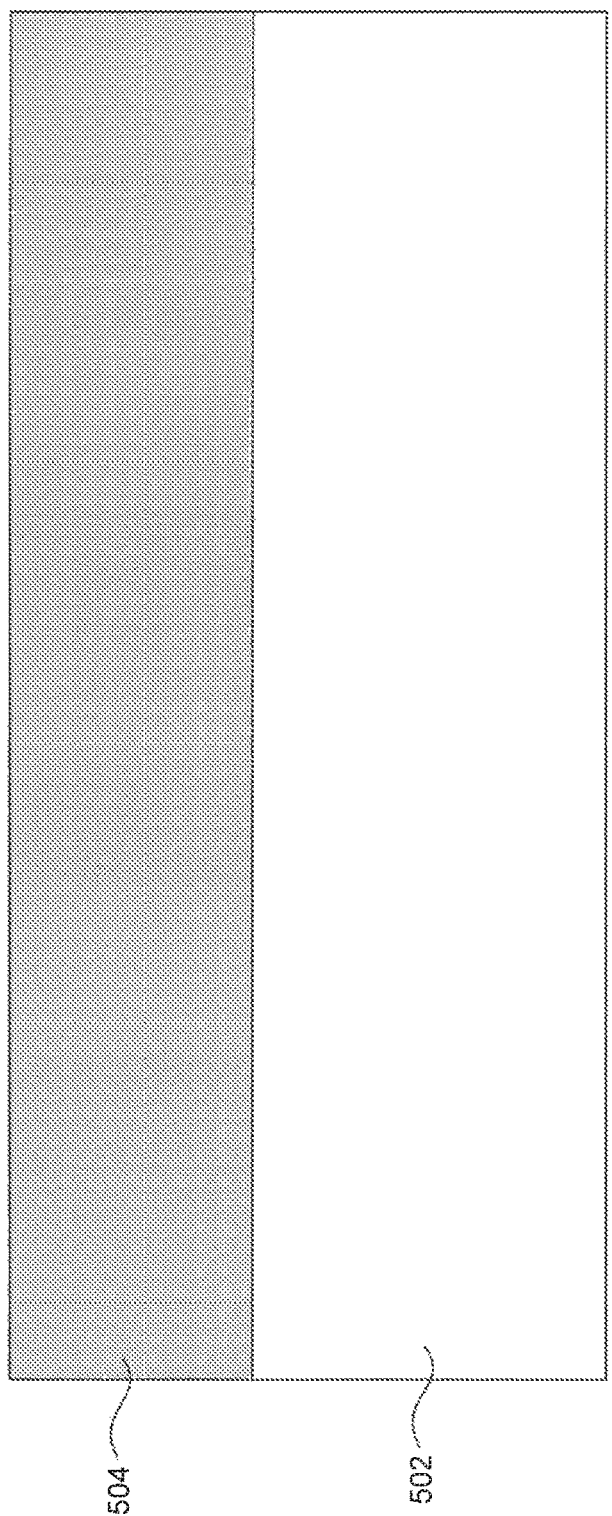

THREE DIMENSIONAL CAPACITOR

CROSS-REFERENCE TO RELATED APPLICATIONS

The present application is a continuation of pending U.S. application Ser. No. 13/715,181, filed on Dec. 14, 2012, which is incorporated by reference herein in its entirety.

TECHNICAL FIELD

The present disclosure relates generally to integrated capacitors.

BACKGROUND

Ferroelectric Capacitors are commonly needed in integrated circuits. Although capacitors serve various functions depending on the circuit design and purpose, it is desirable to minimize the substrate area required to form the capacitors. For instance, one common use of capacitors is to enable charge pumps, which are used to produce necessary voltages for other circuits. One way to produce higher voltages using a charge pump includes employing a larger number of capacitors in the charge pump. However, when the capacitors are integrated with the circuits that they support, this solution can require a significant area of the substrate. Another way to produce higher voltages using a charge pump includes decreasing the thickness of the dielectric that separates the charge pump capacitors' plates. This, however, reduces the maximum voltage that can be stored in the resulting capacitors, and may be precluded in some cases by the minimum required breakdown voltage of the capacitors and/or other devices integrated with the capacitors.

SUMMARY

Integrated capacitor structures and methods for fabricating same are provided. In an embodiment, the integrated capacitor structures exploit the capacitance that can be formed in a plane that is perpendicular to that of the substrate, resulting in three-dimensional capacitor structures. This allows for integrated capacitor structures with higher capacitance to be formed over relatively small substrate areas. Embodiments are suitable for use by charge pumps and can be fabricated to have more or less capacitance as desired by the application.

BRIEF DESCRIPTION OF THE DRAWINGS

The accompanying drawings, which are incorporated herein and form a part of the specification, illustrate the present disclosure and, together with the description, further serve to explain the principles of the disclosure and to enable a person skilled in the pertinent art to make and use the disclosure.

FIG. 1A illustrates an example capacitor structure according to an embodiment.

FIGS. 5A-5E are cross sectional views illustrating various example steps in a method of fabricating a capacitor structure according to an embodiment.

The present disclosure will be described with reference to the accompanying drawings. Generally, the drawing in which an element first appears is typically indicated by the leftmost digit(s) in the corresponding reference number.

DETAILED DESCRIPTION

Figure 1B:
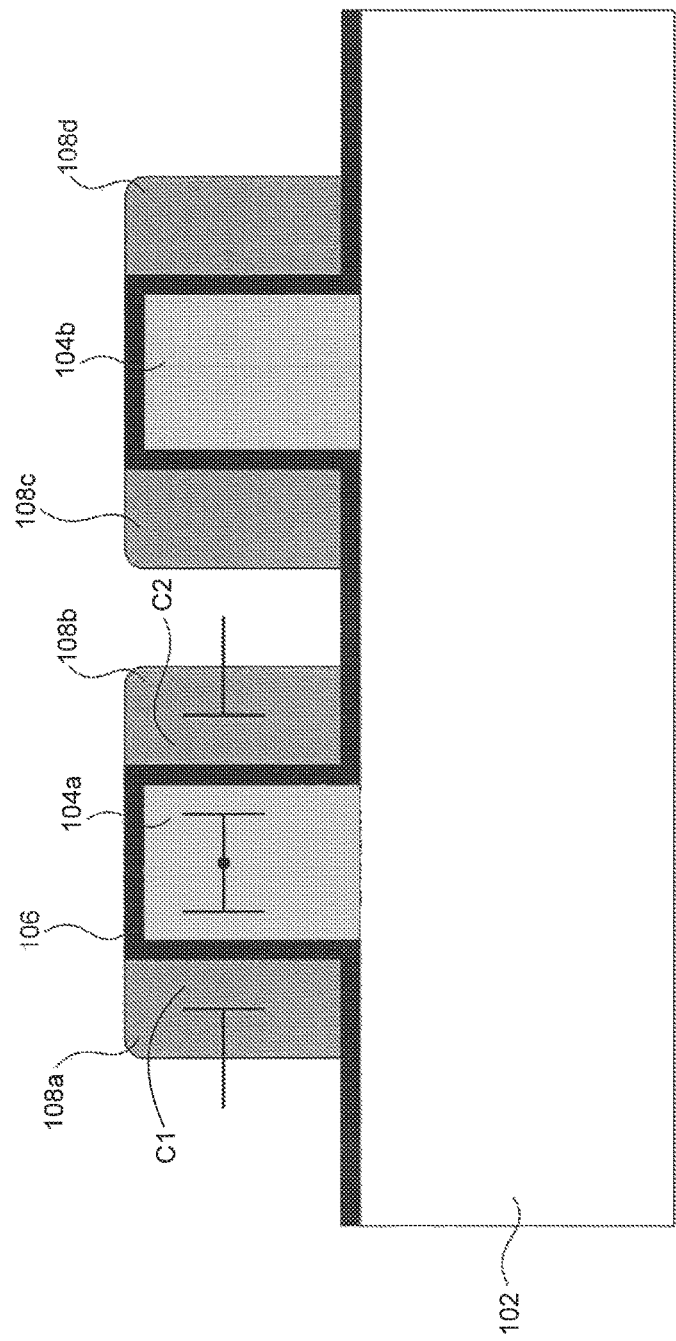
FIG. 1B illustrates example capacitances that can result from the example capacitor structure of FIG. 1A.

The terms "over," "under," "between," and "on" as used herein refer to a relative position of one layer with respect to other layers. As such, for example, one layer deposited or disposed or formed over or under another layer may be directly in contact with the other layer or may have one or more intervening layers. Moreover, one layer deposited or disposed or formed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Capacitors are commonly needed in integrated circuits. For instance, one common use of capacitors is to enable charge pumps, which are used to produce necessary voltages for integrated circuits. For example, charge pumps are integrated into most non-volatile memory integrated circuits in order to produce the necessary (commonly high) voltages for programming, reading, and erasing the memory cells of the memory. Typically, the charge pump receives a single external power supply voltage (e.g., 1.8 or 3.3 Volts) and produces various higher or lower voltages as needed by the memory. For example, the charge pump can double the external power supply voltage by charging two capacitors up to the external power supply voltage, disconnecting the two capacitors from the external power supply, and then connecting the two capacitors In series.

One way to produce higher currents using a charge pump includes employing a larger number of capacitors or capacitors with larger areas. Typically, however, charge pump capacitors are integrated with the same integrated circuits that they support. For example, charge pump capacitors are commonly plate capacitors, formed between a conductor layer (e.g., a polycrystalline silicon layer used for forming gate devices of the integrated circuits) and a conducting substrate, separated by a dielectric (e.g., a gate oxide layer of the gate devices). As such, this solution can require a significant area of the substrate.

Another way to produce higher currents using a charge pump includes increasing the capacitance of the charge pump capacitors. With increasing the capacitor surface area being undesirable, the capacitance can be increased by decreasing the thickness of the dielectric separating the charge pump capacitors' plates. This, however, reduces the maximum voltage that can be stored in the resulting capacitors, and may be precluded in some cases by the minimum required breakdown voltage of the capacitors and/or other devices integrated with the capacitors. For example, if the charge pump capacitors use as dielectric the gate oxide layer of integrated gate devices, then the decrease of the dielectric thickness can be limited by voltage requirements of the integrated gate devices.

Accordingly, there is a need for integrated capacitor structures that can provide high capacitance while requiring small substrate area. Embodiments as further described below provide such integrated capacitor structures by exploiting the capacitance that can be formed in a plane that is perpendicular to that of the substrate. As such, embodiments enable what is referred to herein as a three-dimensional capacitor structure. Embodiments are suitable for use by charge pumps and can be fabricated to have more or less capacitance as desired by the application. A fabrication method for fabricating integrated capacitor structures according to embodiments is also provided.

This specification discloses one or more embodiments that incorporate the features of this patent document. The disclosed embodiment(s) merely exemplify this patent document. The scope of the this patent document is not limited to the disclosed embodiment(s). The present embodiments are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1A illustrates an example capacitor structure 100 according to an embodiment. Example capacitor structure 100 is provided for the purpose of illustration and is not limiting of embodiments. As shown in FIG. 1A, example capacitor structure 100 includes a substrate 102, a first conductor layer disposed over substrate 102 and patterned to form first and second conductors 104a and 104b, a dielectric 106 disposed over first and second conductors 104a and 104b, and a second conductor layer 108 disposed over dielectric layer 106.

First and second conductors 104a and 104b are separated by a separation region 110, and each has a top surface, a first sidewall, and a second sidewall. In an embodiment, first and second conductors 104a and 104b comprise doped polycrystalline silicon (poly), but can be of any conducting material as would be apparent to a person of skill in the art based on the teachings herein.

Dielectric 106 is disposed over first and second conductors 104a and 104b to cover the first sidewall, the second sidewall and optionally the top surface of each of first conductors 104a and 104b. In an embodiment, dielectric 106 also covers the exposed regions of substrate 102, including separation region 110.

In an embodiment, dielectric 106 includes one or more dielectric layers. For example, dielectric 106 may include a silicon nitride layer sandwiched between two silicon dioxide layers to create a three-layer stack collectively and commonly referred to as "ONO." In an embodiment, the silicon nitride layer is used as a charge trapping layer. Other charge trapping dielectric may also be used including a silicon-rich nitride film, or any film that includes, but is not limited to, silicon, oxygen, and nitrogen in various stoichiometries.

The second conductor layer includes a portion 108a disposed along the first sidewall of first conductor 104a, a portion 108b disposed along the second sidewall of first conductor 104a, a portion 108c disposed along the first sidewall of second conductor 104b, and a portion 108d disposed along the second sidewall of second conductor 104b. In an embodiment, the second conductor layer comprises poly, but can be of any conducting material as would be apparent to a person of skill in the art based on the teachings herein.

FIG. 1B illustrates example capacitances that can result from example capacitor structure 100 of FIG. 1A. Specifically, with respect to the structure formed around first conductor 104a, a first capacitance C1 can be formed between the first sidewall of first conductor 104a and portion 108a of the second conductor layer, and a second capacitance C2 can be formed between the second sidewall of first conductor 104a and portion 108b of the second conductor layer. Capacitances C1 and C2 are formed in a plane that is perpendicular to the plane provided by the top surface of substrate 102.

The first and second capacitances C1 and C2 are electrically coupled by a common end provided by first conductor 104a. In an embodiment, the first and second capacitances C1 and C2 may also be electrically coupled by their respective other ends (provided by portion 108a and portion 108b respectively), resulting in the first and second capacitances C1 and C2 being coupled in parallel. This parallel coupling increases the overall capacitance that can be produced by the structure formed around first conductor 104a. Similar capacitances can be produced using the structure formed around second conductor 104b. In another embodiment, when portions 108a and 108b are not electrically coupled, first and second capacitances C1 and C2 may be coupled in series.

Figure 2A:
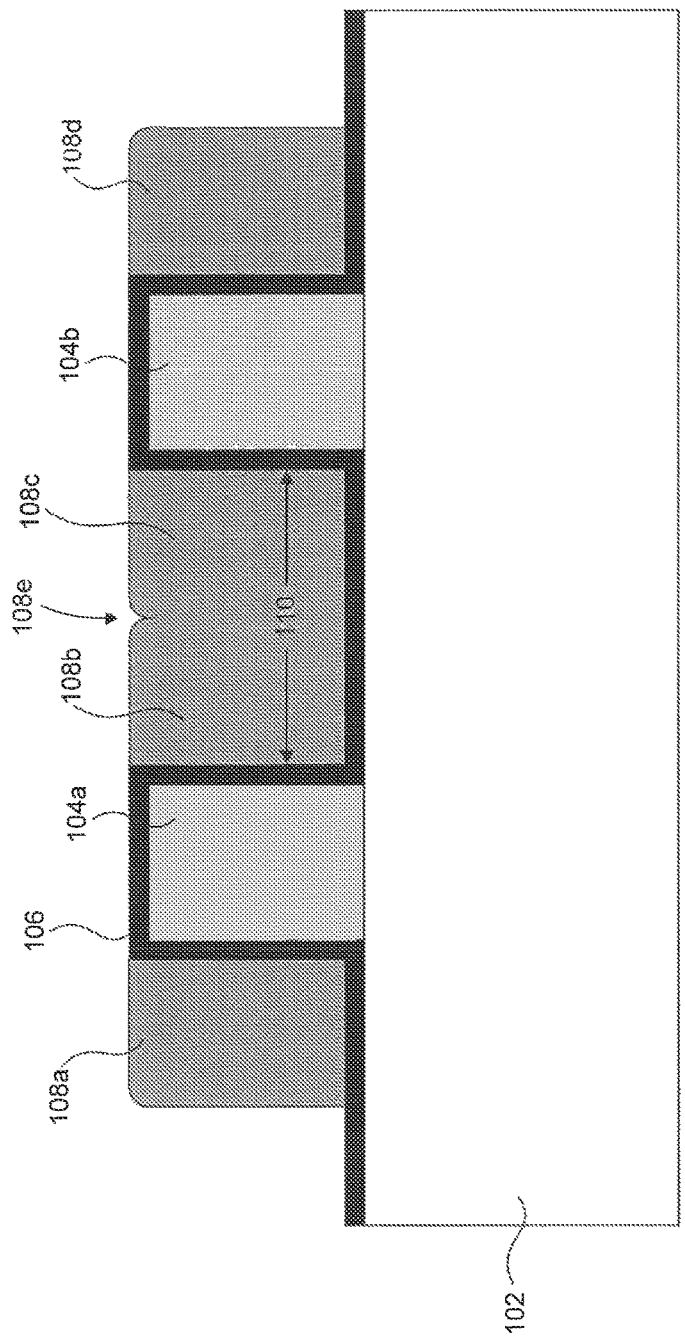
FIG. 2A illustrates another example capacitor structure according to an embodiment.

FIG. 2A illustrates another example capacitor structure 200 according to an embodiment. Example capacitor structure 200 is provided for the purpose of illustration and is not limiting of embodiments. In this example, separation region 110 between first and second conductors 104a and 104b is completely bridged by the second conductor layer. This occurs when a ratio between a height (thickness) of the second conductor layer, when disposed over dielectric 106, and a length of separation region 110 is configured such that portions 108b and 108c form a contiguous portion 108e across separation region 110. In an embodiment, the ratio is configured such that portion 108e includes a pinch off region where portions 108b and 108c meet, as shown in FIG. 2A.

Figure 2B:
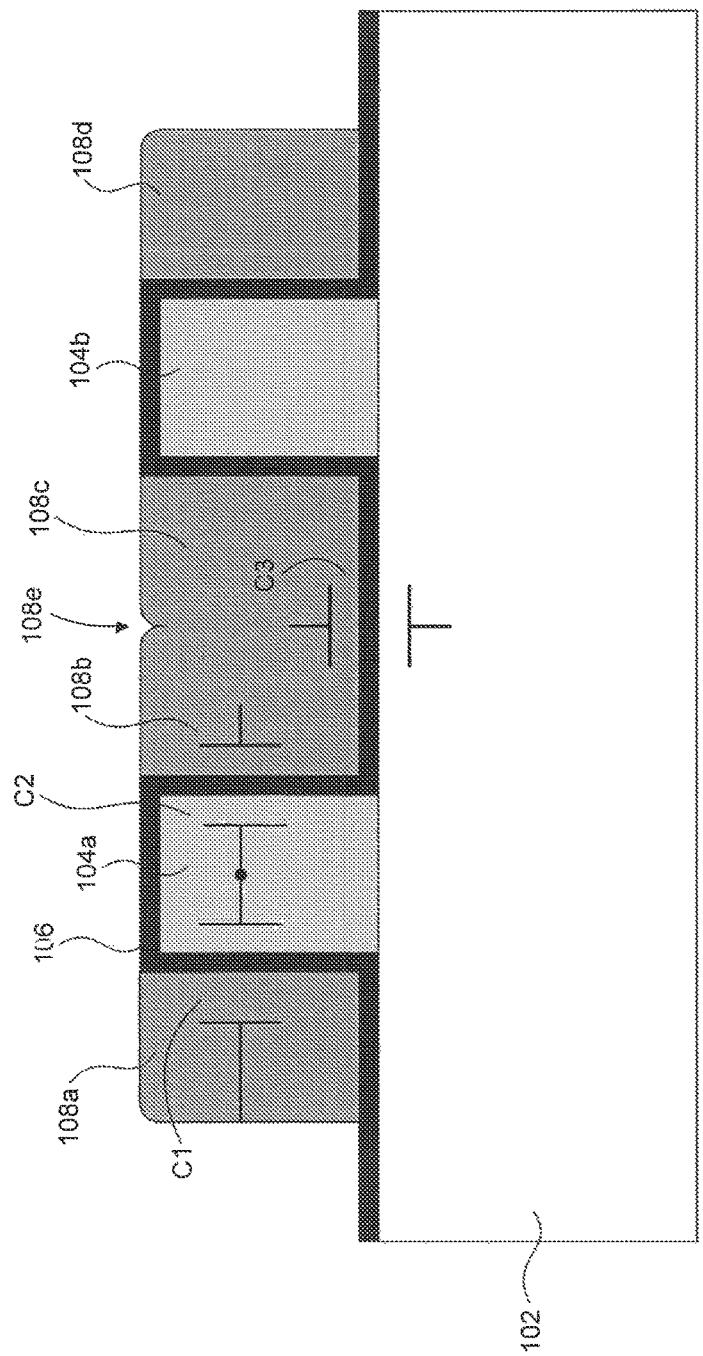
FIG. 2B illustrates example capacitances that can result from the example capacitor structure of FIG. 2A.

FIG. 2B illustrates example capacitances that can result from example capacitor structure 200 of FIG. 2A. Like example structure 100 described above, with respect to the structure formed around first conductor 104a, a first capacitance (capacitor) C1 can be formed between the first sidewall of first conductor 104a and portion 108a of the second conductor layer, and a second capacitance (capacitor) C2 can be formed between the second sidewall of first conductor 104a and portion 108e of the second conductor layer. Similar capacitances can be produced using the structure formed around second conductor 104b.

In addition, a third capacitance C3 can be formed between portion 108e and substrate 102. As a result, in an embodiment, higher capacitance can be realized using example capacitor structure 200 than using example capacitor structure 100. However, with third capacitance C3 being a function of the length of separation region 110, the realized capacitance may be sensitive to process variations in the length of separation region 110.

Figure 3A:
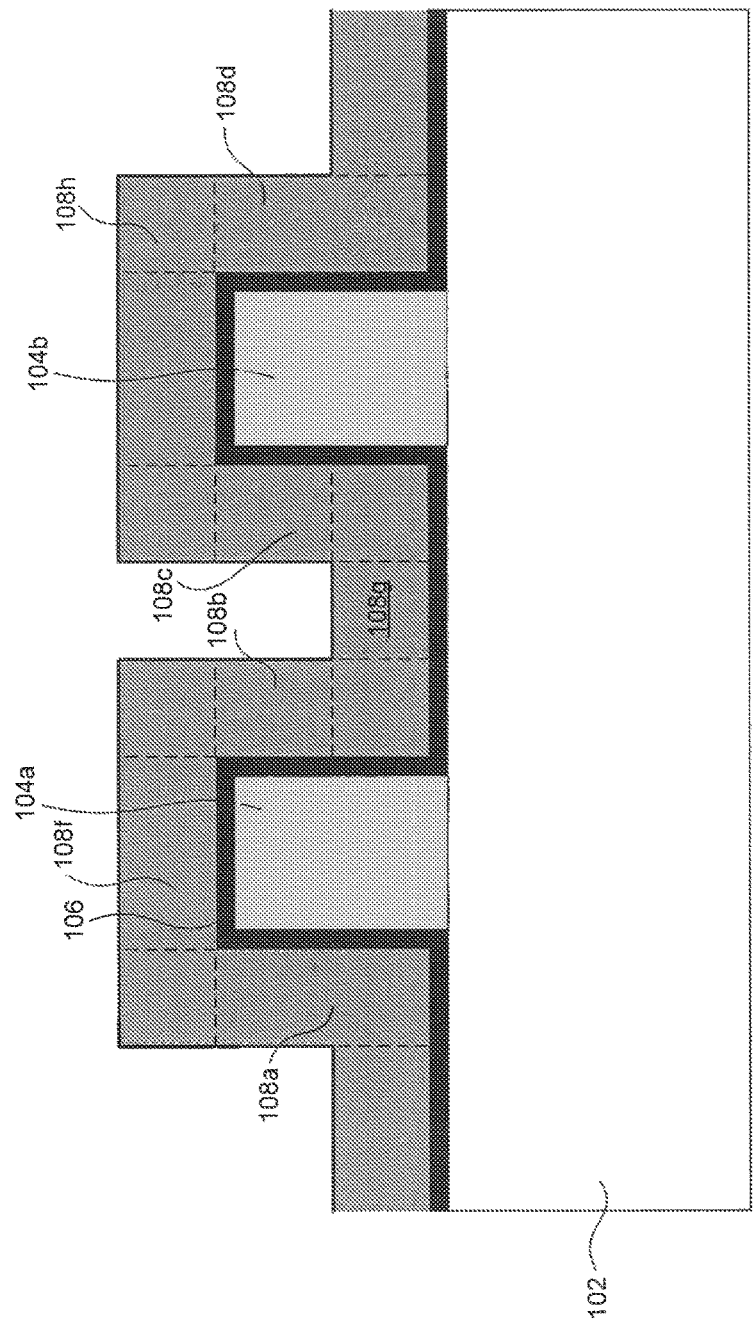
FIG. 3A illustrates another example capacitor structure according to an embodiment.

FIG. 3A illustrates another example capacitor structure 300 according to an embodiment. Example capacitor structure 300 is provided for the purpose of illustration and is not limiting of embodiments. In this example, the second conductor layer is disposed over dielectric 106 and is not etched back, resulting in a single contiguous layer. Specifically, the second conductor layer includes (among other portions) portions 108a, 108b, 108c, 108d, a portion 108f disposed over the top surface of first conductor 104a, a portion 108h disposed over the top surface of second conductor 104b, and a portion 108g disposed between portions 108b and 108c (portion 108g is disposed laterally to first conductor 104a and adjacent to portion 108b).

Figure 3B:
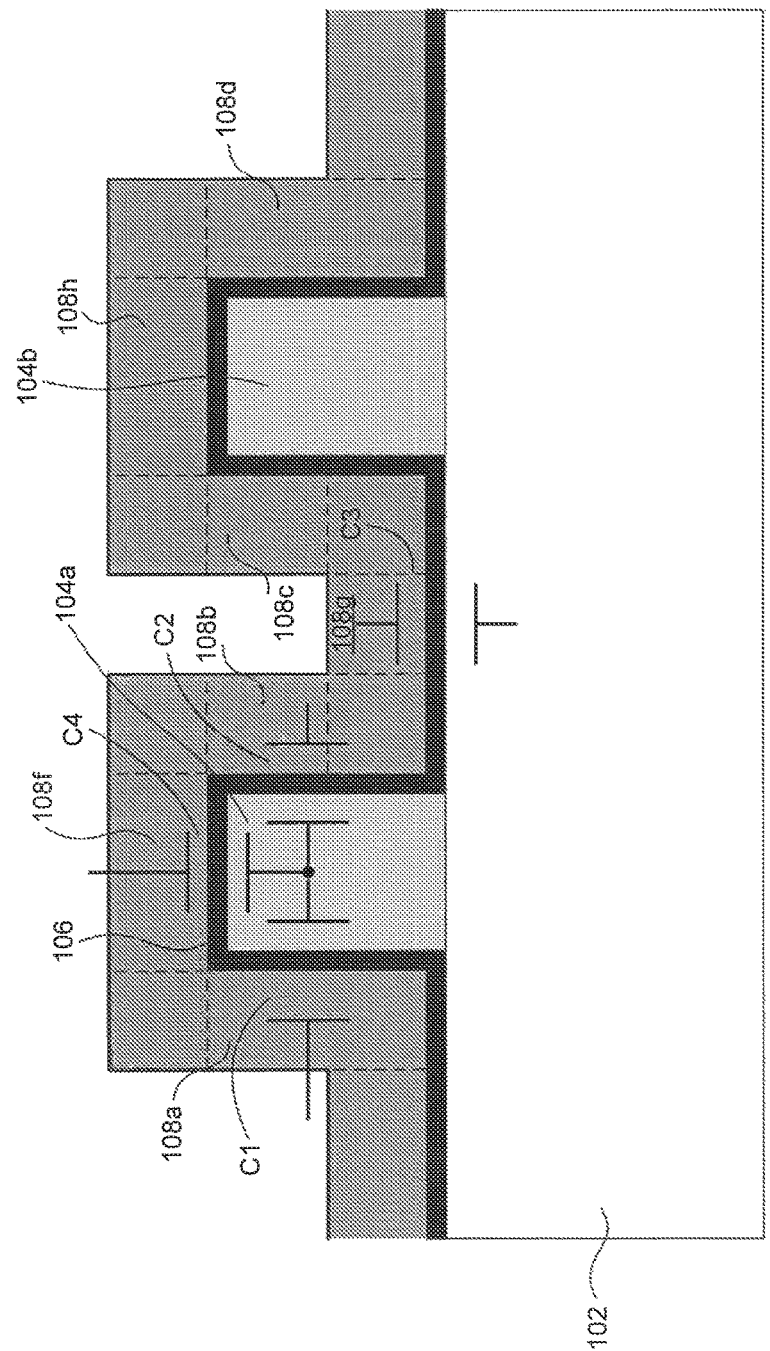
FIG. 3B illustrates example capacitances that can result from the example capacitor structure of FIG. 3A.

FIG. 3B illustrates example capacitances that can result from example capacitor structure 300 of FIG. 3A. Like example structure 100 described above, with respect to the structure formed around first conductor 104a, a first capacitance C1 can be formed between the first sidewall of first conductor 104a and portion 108a of the second conductor layer, and a second capacitance C2 can be formed between the second sidewall of first conductor 104a and portion 108b of the second conductor layer. Further, a fourth capacitance C4 can be formed between portion 108f of the second conductor layer, which is disposed over the top surface of first conductor 104a, and the top surface of first conductor 104a. Similar capacitances can be produced using the structure formed around second conductor 104b.

The first, second, and fourth capacitances C1, C2, and C4 are electrically coupled by a common end provided by first conductor 104a. In an embodiment, the first, second, and fourth capacitances C1, C2, and C4 are also electrically coupled by their respective other ends (provided by portions 108a, 108b, and 108f respectively of the second conductor layer), resulting in the first, second, and fourth capacitances C1, C2, and C4 being coupled in parallel. This parallel coupling increases the overall capacitance that can be produced by the structure formed around first conductor 104a.

In addition, like example capacitor structure 200, a third capacitance C3 can be formed between the portion of the second conductor layer that sits between first and second conductors 104a and 104h and substrate 102. This portion of the second conductor includes portion 108g and respective regions of portions 108b and 108c that sit above substrate 102.

In an embodiment, higher capacitance can be realized using example capacitor structure 300 than using example capacitor structures 100 and 200. However, the overall realized capacitance may vary with third capacitance C3 being a function of the length of separation region 110 (and may thus be sensitive to process variations in the length of separation region 110) and fourth capacitance C4 being a function of the width of the first and second conductors 104a and 104b (and thus may be sensitive to lithography critical dimension (CD) variations that may cause the width of the disposed conductors to vary from one capacitor structure to another).

Figure 4:
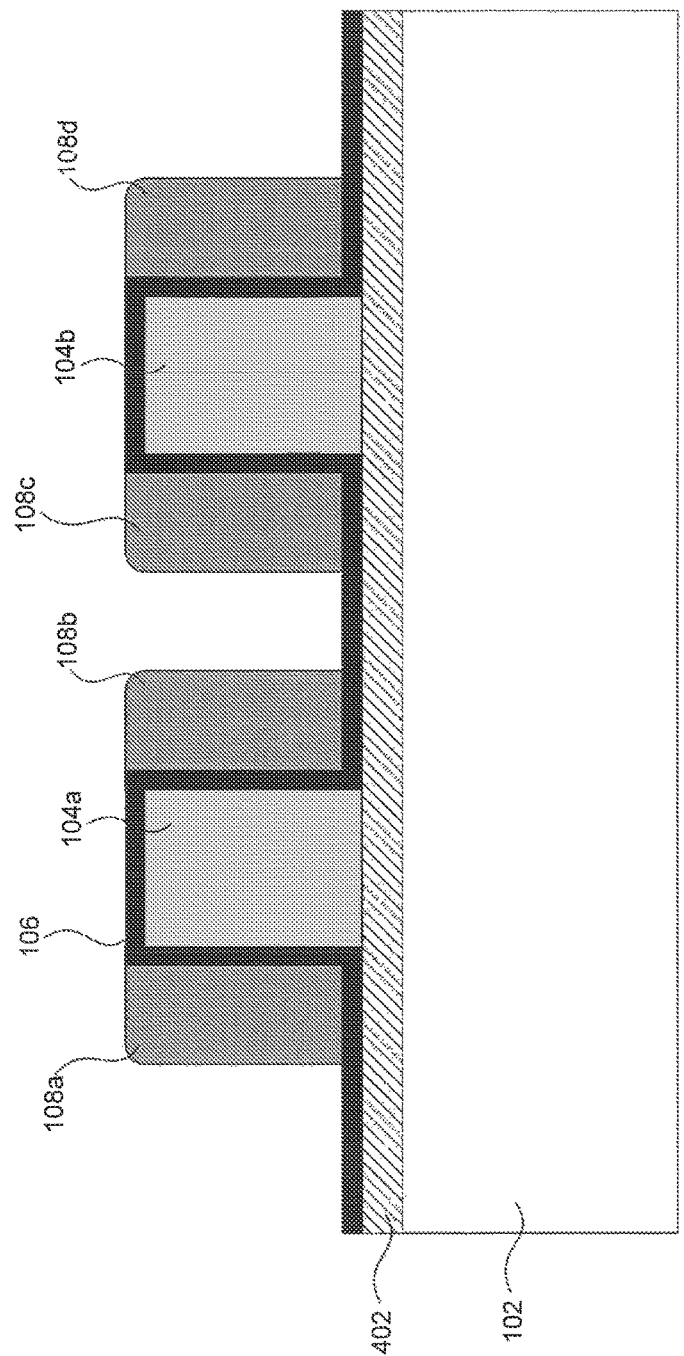
FIG. 4 illustrates another example capacitor structure according to an embodiment.

In the embodiments described above in FIGS. 1A, 2A, and 3A, the first conductor layer is disposed directly over substrate 102 and then patterned to form first and second conductors 104a and 104b. Dielectric 106 is then disposed over first and second conductors 104a and 104b to cover the top surface, the first sidewall, and the second sidewall of each of first conductors 104a and 104b and the exposed regions of substrate 102, including separation region 110. In other embodiments, as illustrated in FIG. 4, for example, an isolation layer 402 is disposed over substrate 102 before disposing the first conductor layer. The first conductor layer is then disposed over isolation layer 402 and patterned to form first and second conductors 104a and 104b over isolation layer 402. Isolation layer 402 can be a dielectric (e.g., oxide) or an insulating substrate, for example, and serves to increase the voltage potential that can be applied to the resulting capacitor structure without causing it damage.

FIGS. 5A-5E are cross sectional views illustrating various example steps in a method of fabricating a capacitor structure according to an embodiment. These example steps are provided for the purpose of illustration and are not limiting of embodiments. The method illustrated in FIGS. 5A-5E can be used to fabricate the example capacitor structures described in FIGS. 1A, 2A, 3A, and 4 above.

Description of the fabrication method begins with reference to FIG. 5A, which shows a first conductor layer 504 disposed over a substrate 502. Substrate 502 can be a silicon substrate, and first conductor layer 504 can be a polycrystalline silicon (poly), for example. First conductor layer 504 can be disposed over substrate 502 by a standard deposition process. In another embodiment, an isolation layer (e.g., dielectric or insulating substrate) (not shown in FIG. 5A) is disposed over substrate 502, and first conductor layer 504 is disposed over the isolation layer. This increases the voltage potential that can be applied to the resulting capacitor structure without causing it damage.

Figure 5B:
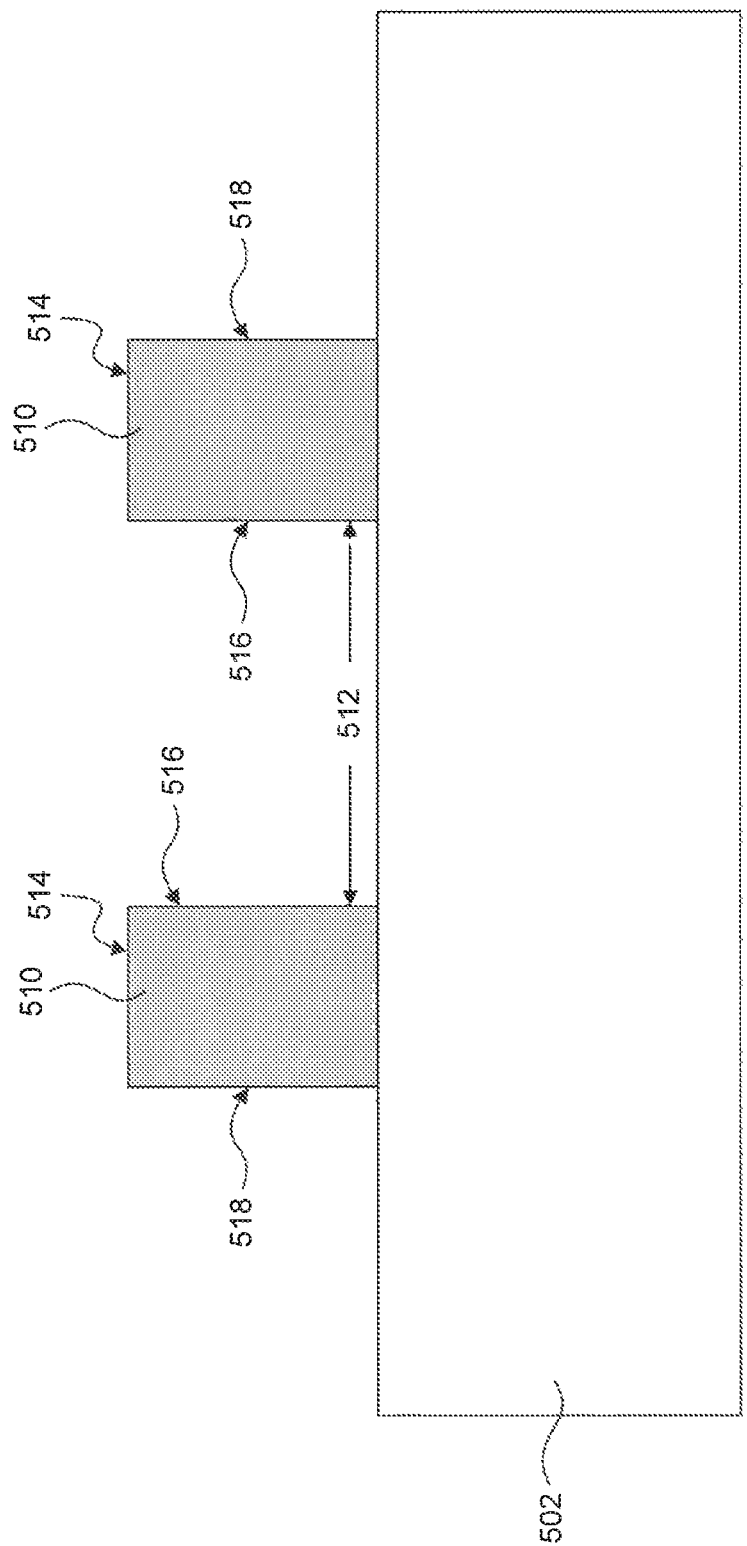

Then, as shown in FIG. 5B, first conductor layer 504 is patterned to form first and second conductors 510, spaced by a separation region 512. Each of the first and second conductors 510 has a top surface 514, a first sidewall 516, and a second sidewall 518. In an embodiment, patterning first conductor layer 504 to form first and second conductors 510 includes creating a photo resist mask (e.g., using standard lithography steps) over substrate 502 and etching (e.g., dry etching) first conductor layer 504 according to the created photo resist mask. The photo resist mask is then stripped and a wet clean is performed. It will be understood by one having ordinary skill in the art that more than conductor structures resembling first and second conductors 510 may be formed in the same or subsequent process steps.

Figure 5C:
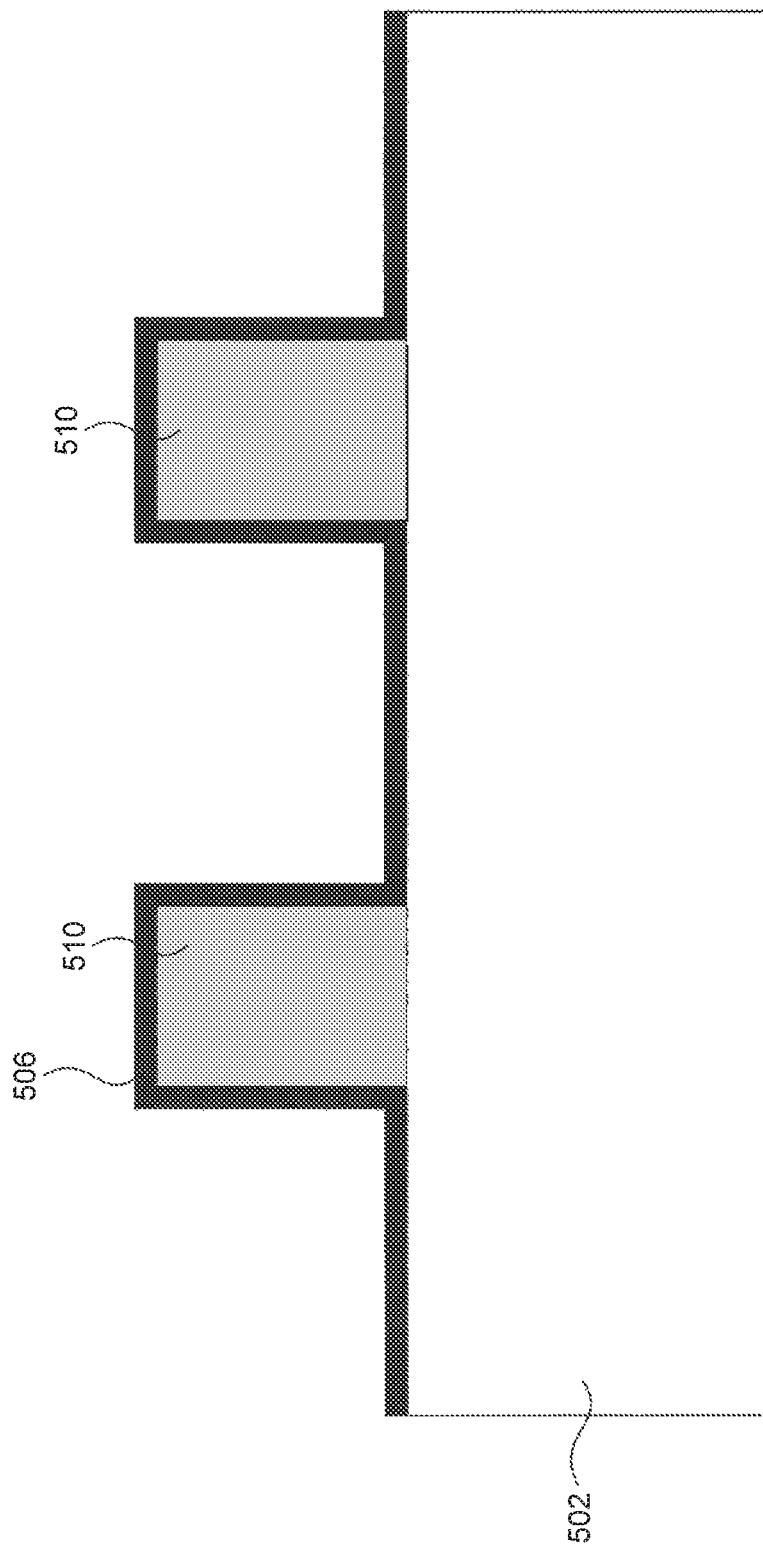

Subsequently, as illustrated in FIG. 5C, a dielectric 506 is disposed over first and second conductors 510 (and/or other conductors) and the exposed regions of substrate 502. In an embodiment, the dielectric includes one or more dielectric layers. For example, the dielectric may include a silicon nitride layer sandwiched between two silicon dioxide layers to create a three-layer stack collectively and commonly referred to as "ONO." In an embodiment, the silicon nitride layer is used as a charge trapping layer. Other charge trapping dielectric may also be used including a silicon-rich nitride film, or any film that includes, but is not limited to, silicon, oxygen, and nitrogen in various stoichiometries.

In an embodiment dielectric 506 includes a bottom oxide layer, a nitride layer, and a top oxide layer. To form the dielectric, bottom oxide layer is formed (e.g., grown or deposited) over the first and second conductors 510 and the exposed regions of substrate 502. Then, the nitride layer is formed (e.g., deposited) over the bottom oxide layer, and the top oxide layer is formed (e.g., grown or deposited) over the nitride layer.

Figure 5D:
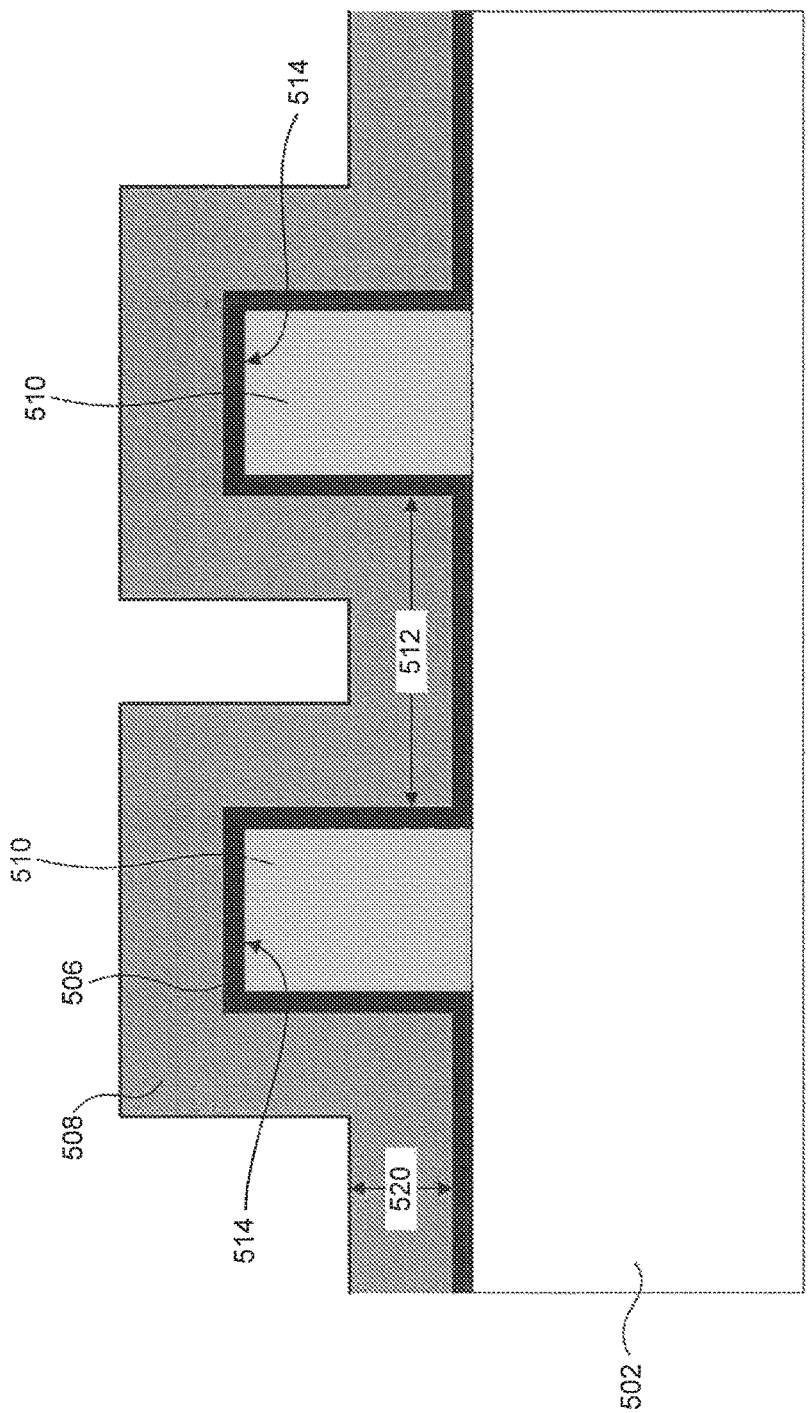

Then, as illustrated in FIG. 5D, a second conductor layer 508 is disposed over dielectric 506. Second conductor layer 508 can be a poly layer, for example. Second conductor layer 508 can be disposed over dielectric layer 506 by a standard deposition process, for example. In an embodiment, a height 520 of second conductor layer 508 is greater than a half length of separation region 512 between first and second conductors 510. As such, the portion of second conductor layer 508 that is disposed over separation region 512 bridges separation region 512 between first and second conductors 510 as shown in FIG. 2A, for example.

In an embodiment, the fabrication method terminates with the step illustrated in FIG. 5D, resulting in a capacitor structure similar to example capacitor structure 300 described above in FIGS. 3A and 3B. As described above, such capacitor structure has the added capacitance that results between second conductor layer 508 and top surface 514 of first or second conductors 510. For the same reason, however, the overall capacitance of the structure may vary due to lithography critical dimension (CD) variations that may cause the width of the disposed first and second conductor 510 to vary from one capacitor structure to another.

Figure 5E:
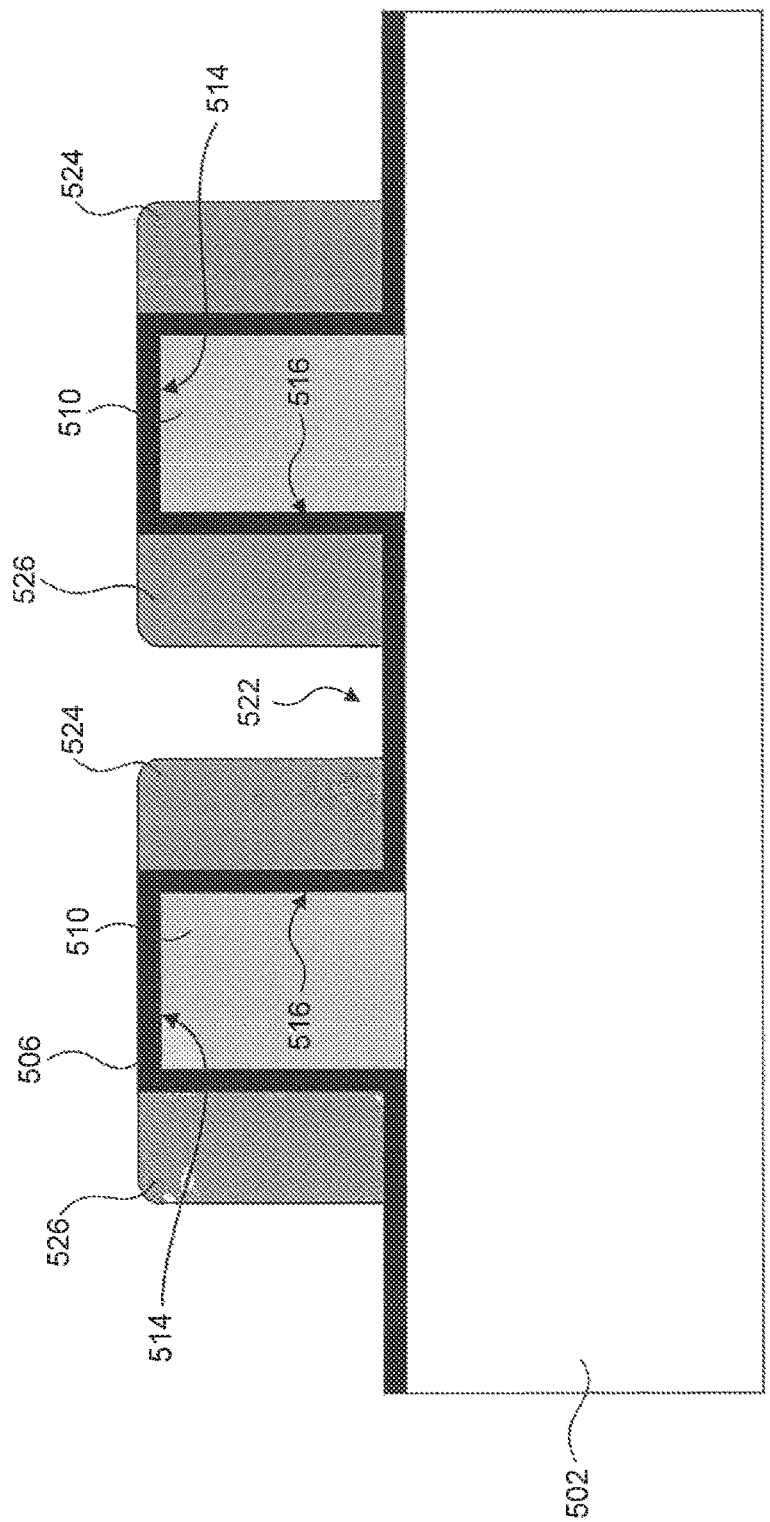

In another embodiment the fabrication method then proceeds as illustrated in FIG. 5E, where second conductor layer 508 is etched (e.g., anisotropically dry etched). In an embodiment, second conductor layer 508 is etched over top surfaces 514 of first and second conductors 510 until dielectric 506 is exposed. The etching also exposes dielectric 506 in a portion 522 of separation region 512 and results in the formation of first and second spacers 524 and 526 (of second conductor layer 508) along first sidewalls 516 of first and second conductors 510 respectively. The resulting capacitor structure is similar to example capacitor structure 100 described above in FIGS. 1A and 1B. As described above, this structure is less sensitive to lithography CD variations, which makes it suitable for applications requiring substantially constant capacitance, such as charge pumps, for example.

Embodiments have been described above with the aid of functional building blocks illustrating the implementation of specified functions, and relationships thereof The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A device, comprising:
   a first conductor disposed directly on a substrate, wherein a bottom surface of the first conductor is in contact with a semiconducting portion of the substrate and the first conductor further includes a top surface, first and second sidewalls;
   a dielectric structure disposed at least partly over the first conductor; and
   a second conductor disposed over and covering the dielectric structure partly, wherein the second conductor is not disposed over the top surface of the first conductor.

2. The device of claim 1, wherein the second conductor includes first and second portions, the first portion being disposed along the first side wall of the first conductor, and the second portion along the second side wall.

3. The device of claim 2, wherein the first and second portions of the second conductor are in direct contact with the dielectric structure.

4. The device of claim 2, wherein the first and second portions of the second conductor are electrically isolated from one another.

5. The device of claim 2, wherein:
   the first portion of the second conductor, the dielectric structure, and the first conductor form a first capacitor;
   the second portion of the second conductor, the dielectric structure, and the first conductor form a second capacitor; and
   the first and second capacitors are coupled in series and perpendicular to the substrate.

6. The device of claim 1, wherein the dielectric structure completely encapsulates the top surface and the first and second sidewalls of the first conductor.

7. The device of claim 1, wherein the dielectric structure includes a multi-layer structure comprising oxide-nitride-oxide (ONO) layers.

8. The device of claim 1, wherein the first and second conductors include polycrystalline silicon.

9. The device of claim 1, wherein a portion of the dielectric structure that is disposed over the top surface of the first conductor is exposed.

10. An apparatus, comprising:
    a first conductor disposed directly on a substrate, wherein the first conductor includes first and second portions disposed laterally on the substrate and bottom surfaces of the first and second portions are in contact with a semiconducting portion of the substrate, the first and second portions each further including a top surface and first and second sidewalls;
    a dielectric structure disposed over at least the first and second sidewalls of the first and second portions; and a second conductor disposed partly over the dielectric structure, the second conductor includes first, second, third, and fourth portions, wherein the first and second portions disposed along the first and second sidewalls of the first portion of the first conductor respectively, and the third and fourth portions disposed along the first and second sidewalls of the second portion of the first conductor respectively, and wherein the second conductor is not disposed over the top surfaces of the first and second portions of the first conductor.

11. The apparatus of claim 10, wherein the first, second, third, and fourth portions of the second conductor are electrically isolated from one another.

12. The apparatus of claim 11, wherein:
the first portion of the second conductor, the dielectric structure, and the first portion of the first conductor form a first capacitor;
the second portion of the second conductor, the dielectric structure, and the first portion of the first conductor form a second capacitor, the first and second capacitors are coupled in series;
the third portion of the second conductor, the dielectric structure, and the second portion of the first conductor form a third capacitor; and
the fourth portion of the second conductor, the dielectric structure, and the second portion of the first conductor form a fourth capacitor, and the third and fourth capacitors are coupled in series.

13. The apparatus of claim 10, wherein a portion of the dielectric structure that is disposed over the top surfaces of the first and second portions of the first conductor is not covered by the second conductor.

14. The apparatus of claim 10, wherein the first and second portions of the first conductor include a similar structure, material, and dimension.

15. The apparatus of claim 10, wherein the second and third portions of the second conductor are disposed between the first and second portions of the first conductor.

16. A capacitor device, comprising:
a plurality of first conductor structures formed directly on a substrate, each including a similar dimension, top and surfaces, and two sidewalls, wherein the bottom surfaces of the plurality of first conductor structures are in contact with a semiconducting portion of the substrate;
a dielectric structure disposed over at least one of the sidewalls of each of the plurality of first conductor structures; and
a plurality of second conductor structures formed at least partly over the dielectric structure, wherein each of the plurality of second conductor structures is disposed along one sidewall of one of the plurality of first conductor structures, and electrically isolated from one another, and wherein the plurality of second conductor structures are not disposed over the top surfaces of the plurality of first conductor structures.

17. The device of claim 16, wherein the dielectric structure includes a multi-layer structure comprising oxide-nitride-oxide (ONO) layers.

* * * * *